United States Patent [19]

Kozaki

[11] Patent Number: 5,742,367
[45] Date of Patent: Apr. 21, 1998

[54] LIQUID-CRYSTAL DISPLAY DEVICE HAVING A STACKED ARRANGEMENT OF AN LCD FOR DISPLAYING AN IMAGE, A LIQUID CRYSTAL SHUTTER, AND A SOLAR CELL PANEL

[75] Inventor: Yoshiyuki Kozaki, Kyoto, Japan

[73] Assignee: Rohm Co., Ltd., Kyoto, Japan

[21] Appl. No.: 641,816

[22] Filed: May 2, 1996

[30] Foreign Application Priority Data

May 11, 1995 [JP] Japan ................. 7-113304

[51] Int. Cl.$^6$ .................. G02F 1/1335; G02F 1/1347; G02F 1/133
[52] U.S. Cl. .................. 349/64; 349/65; 349/68; 349/74; 349/116
[58] Field of Search .................. 359/53, 69, 48, 359/49, 72; 345/211, 212; 349/61, 64, 65, 68, 74, 116; 368/242; 968/931

[56] References Cited

U.S. PATENT DOCUMENTS

| | | | |
|---|---|---|---|
| 4,139,279 | 2/1979 | Laesser et al. | 349/116 |
| 5,153,760 | 10/1992 | Ahmed | 349/116 |
| 5,289,998 | 3/1994 | Bingley et al. | 244/173 |
| 5,406,323 | 4/1995 | Tanigaki et al. | 348/794 |
| 5,523,776 | 6/1996 | Hougham et al. | 359/896 |

FOREIGN PATENT DOCUMENTS

| | | |
|---|---|---|
| 60-182177 | 9/1985 | Japan . |
| 1-120076 | 5/1989 | Japan . |

*Primary Examiner*—William L. Sikes
*Assistant Examiner*—Walter J. Malinowski
*Attorney, Agent, or Firm*—Brumbaugh, Graves, Donohue & Raymond

[57] ABSTRACT

A liquid-crystal display device including a transmission-type liquid-crystal panel for displaying an image, a power source circuit for driving the liquid-crystal panel, a solar-cell panel disposed behind the liquid-crystal panel so as to be excited by external light transmitted through the liquid-crystal panel for generating electromotive force to thereby charge the power source circuit, and a liquid-crystal shutter provided between the liquid-crystal panel and the solar-cell panel for controlling the amount of external light to be transmitted to the solar-cell panel. In the device, the power source circuit can be sufficiently charged by the electromotive force from the solar-cell panel to prolong the operating time of the displayed device without increasing the area for installation of the solar-cell panel.

7 Claims, 2 Drawing Sheets

LIQUID-CRYSTAL DISPLAY DEVICE HAVING A STACKED ARRANGEMENT OF AN LCD FOR DISPLAYING AN IMAGE, A LIQUID CRYSTAL SHUTTER, AND A SOLAR CELL PANEL

BACKGROUND OF THE INVENTION

1. Field of the Invention

The present invention generally relates to a liquid-crystal display device and particularly to a portable liquid-crystal display device having a power source circuit capable of being charged by a solar cell.

2. Description of the Related Art

A liquid-crystal display is often used as a portable display device in a liquid-crystal television set, a VTR camera with a liquid-crystal screen, or the like because such a liquid-crystal display is less in power consumption compared with other displays such as CRT display, plasma display, and so on. The display device of such a dot-matrix display system as used in a liquid-crystal television set is high in power consumption because it is higher in liquid-crystal panel driving frequency and larger in scale of operating circuit compared with a display device of a segment display system for displaying only numerals/characters in such a portable device as a desk-top calculator, a watch, or the like, as shown in FIG. 3. In a solar-cell panel 5a having such an area as used in a desk-top calculator shown in FIG. 3, however, it is impossible to obtain sufficient electromotive force in order to use the solar-cell panel 5a as a display device for a liquid-crystal television set or the like. To obtain sufficient electromotive force, on the contrary, a solar-cell panel having an area several times as large as that of the above-mentioned solar-cell panel 5a is required. Accordingly, no solar cell has been used as a power source to be provided on a liquid-crystal panel installation place in a display device but a dry battery or a chargeable secondary battery has been used as such a power source.

Incidentally, such a desk-top calculator as shown in FIG. 3 is constituted by a key portion 11 including a plurality of keys for entry of numerical values or the like, a liquid-crystal display portion 1a for displaying numerical values or the like, and the solar-cell panel portion 5a for receiving light to generate electromotive force to thereby act as a power source, all of those parts being disposed on one surface of a box-shaped housing 6a.

However, in a liquid-crystal display device in a liquid-crystal television set, there is a problem that operation can be executed only for about several hours in the case where a power source attached to the device or a separately available power source is used, and there is a demand to reduce the number of auxiliary power sources to be as small as possible because a power source to be used in such a liquid-crystal display device is comparatively heavy in weight.

In order to solve the above problem and in order to satisfy the above demand, it is possible to consider that the area of the solar-cell panel used in the desk-top calculator as shown in FIG. 3 is enlarged so that a secondary battery is charged by the electromotive force generated in the solar-cell panel so as to be used as a power source. In a case where the consumption power is very low, for example, several tens or hundreds μW, like in a desk-top calculator, it is sufficient to provide a solar-cell panel having an area of several cm² on a surface of the device. Using a solar-cell panel as a power source for a liquid-crystal panel of a liquid-crystal television set or the like, on the contrary, there is a problem that it becomes necessary to use a solar-cell panel having an area of several hundreds cm², which is larger than the area of the liquid-crystal panel per se.

SUMMARY OF THE INVENTION

It is therefore an object of the present invention to solve the above problems and to provide a liquid-crystal display device in which a power source of the device can be sufficiently charged by a solar-cell panel without increasing the area of the device for installation of the solar-cell panel to thereby prolong the time of use of the device.

In order to attain the above object, according to an aspect of the present invention, there is provided a liquid-crystal display device comprising: a transmission-type liquid-crystal panel for displaying an image; a solar-cell panel disposed behind the liquid-crystal panel; a liquid-crystal shutter provided between the liquid-crystal panel and the solar-cell panel for controlling a quantity of light incident to the solar-cell panel through the liquid-crystal panel; and a power source circuit which is charged by electromotive force generated in the solar-cell panel.

DETAILED DESCRIPTION OF THE PREFERRED EMBODIMENT

Figure 1:
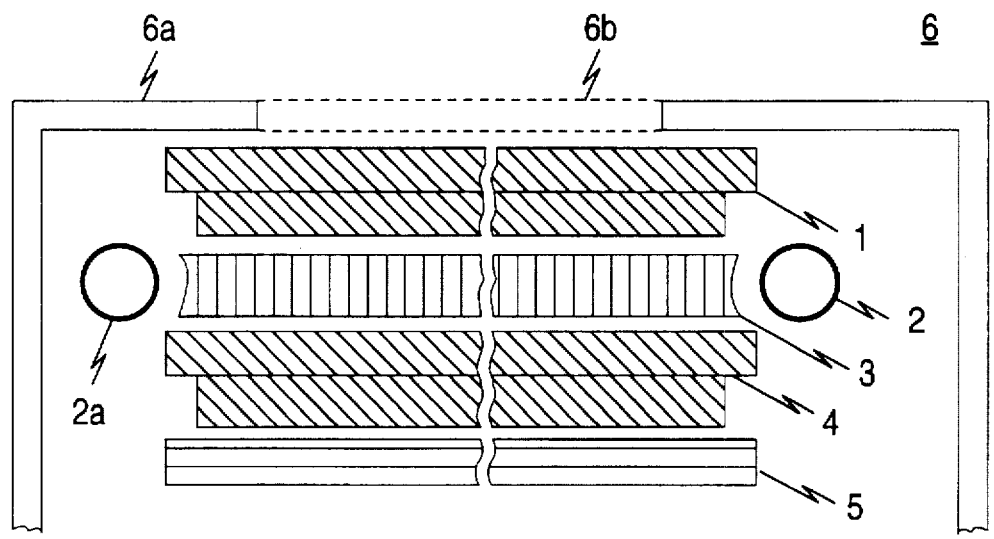
FIG. 1 is a vertical sectional view showing the structure of a liquid-crystal display device as an embodiment of the present invention.
Figure 2:
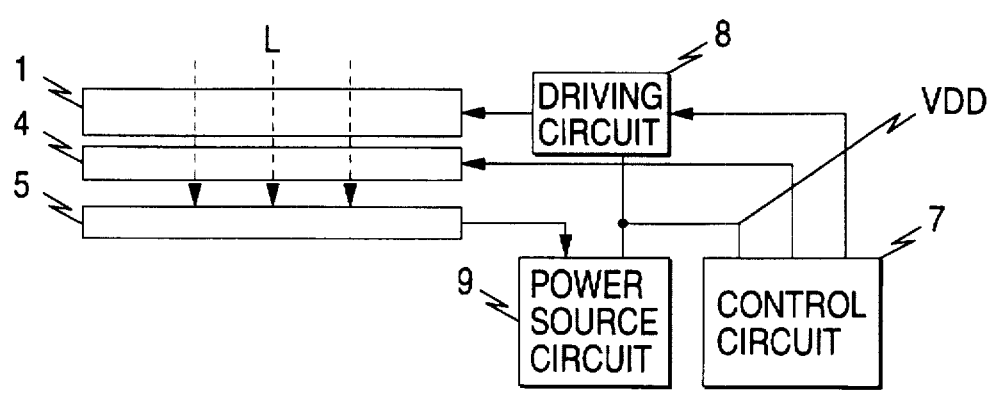
FIG. 2 is a block diagram showing the circuit configuration of the liquid-crystal display device of FIG. 1.
Figure 3:
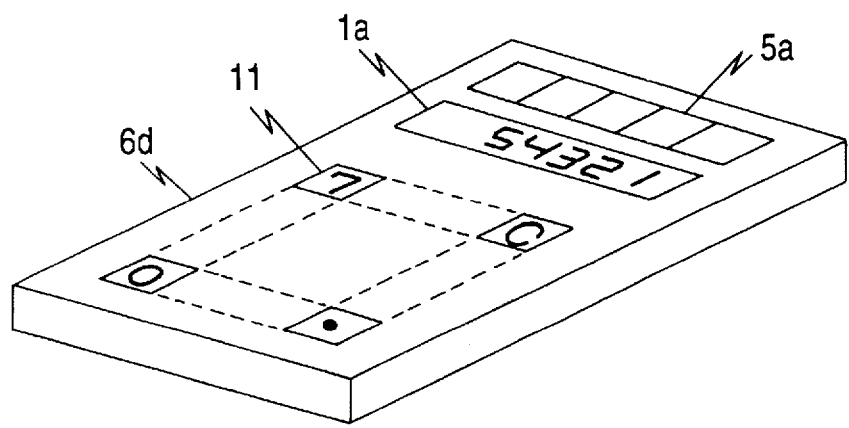
FIG. 3 is a perspective view showing a desk-top calculator as an example of a conventional liquid-crystal display device.

Referring to FIGS. 1 and 2, an embodiment of the present invention will be described below in detail. In all the drawings, the same or equivalent constitutional parts as or to each other are referenced correspondingly to thereby simplify the description.

FIG. 1 is a sectional view typically showing the structure of a liquid-crystal display device according to the present invention. A transmission type liquid-crystal panel 1 for displaying an image of a television or the like is mounted in a window portion 6b provided in a housing 6a of a liquid-crystal display device 6. A back-light portion is provided for making a display screen bright to make it easy to see, the back-light portion being constituted by a light diffusion plate 3 provided behind the liquid-crystal panel 1 and lamps 2 and 2a acting as light sources provided on the sides of the light diffusion plate 3. A liquid-crystal shutter 4 is provided behind the light diffusion plate 3 and a solar-cell panel 5 is provided behind the liquid-crystal shutter 4 so that the liquid-crystal shutter 4 acts to transmit/shut external light to the underlying solar-cell panel 5 and the solar-cell panel 5 acts to generate electromotive force by light. The solar-cell panel 5 has a light receiving area which is substantially equal to the area of the liquid-crystal panel 1. In FIG. 1, illustration of a driving circuit for driving the liquid-crystal panel 1 is omitted for the sake of simplification. The driving circuit may be disposed in any place, for example, in a space on the side of the liquid-crystal panel, in a space behind the solar-cell panel, or the like.

As the liquid-crystal panel 1, a dot-matrix type liquid-crystal panel may be used of TFT (thin-film transistor) or STN (super-twisted nematic). As the liquid-crystal shutter 4, any liquid-crystal panel may be used so long as it can perform shutter operation for transmitting/shutting external light to the solar-cell panel 5. The liquid-crystal shutter may have such a structure that the shutter portion is divided into a plurality of divisional portions so that light can be transmitted selectively partly through any of the divisional portions. The solar-cell panel 5 may have a structure in which a plurality of solar-cell panels each of which is formed of a silicon element of the silicon monocrystal type or of the amorphous type are connected in series and in parallel so as to obtain a predetermined output voltage.

FIG. 2 is a block diagram showing the circuit configuration of the liquid-crystal display device of FIG. 1, for use, in a television set or the like as a liquid-crystal display device thereof. The circuit of this liquid-crystal display device is constituted by, in addition to the liquid-crystal panel 1, the liquid-crystal shutter 4 and the solar-cell panel 5 disposed as shown in FIG. 1, a control circuit 7 for performing processing on a video signal for liquid crystal display of an image and for performing control of the operation of the liquid-crystal shutter 4, a driving circuit 8 for driving the liquid-crystal panel 1, and a power source circuit 9 which acts as a power source for the respective circuits. The power source circuit 9 is constituted by: a main power source portion which uses a dry battery or a secondary battery attached to the liquid-crystal display device; an auxiliary power source portion constituted by a built-in secondary battery, an electrolytic capacitor, or the like, which can be charged by the electromotive force generated by the solar-cell panel 5; and a control portion for performing source output switching, charging operation, and so on. Incidentally, illustration of the constitutional parts relating to the back-light portion is omitted in the drawing for the sake of simplification of explanation.

Referring to FIG. 2, the operation of the embodiment will be described below. During display operation in which an image is being displayed on the liquid-crystal screen, the liquid-crystal shutter 4 operates to shut incident external light L so that the light L is not transmitted into the solar-cell panel 5, and, therefore, the electromotive force generated in the solar-cell panel 5 is too small to carry out the charging operation in the auxiliary power source portion. At this time, the control circuit 7 and the driving circuit 8 are supplied with electric power from the main power source portion of the power source circuit 9 through power source lines $V_{DD}$ so that the liquid-crystal panel 1 is driven by the driving circuit 8 to display an image on the basis of a video signal from the control circuit 7.

During not-display operation in which no image is displayed on the liquid crystal screen, the liquid-crystal shutter 4 operates to allow the incident external light L to be transmitted into the solar-cell panel 5, and, therefore, the electromotive force generated in the solar-cell panel 5 charges the auxiliary power source portion of the power source circuit 9. The electric power of the thus charged auxiliary power source portion may be used as a spare power source when the voltage of the main power source portion in the next display operation decreases or as an auxiliary power source for supplying electric power in cooperation with the main power source portion to increase the power source capacity to prolong the operation time. In the case where a secondary battery is used in the main power source portion, the configuration is designed so that the secondary battery may be charged.

The liquid-crystal shutter 4 may be designed in any manner so that the liquid-crystal shutter 4 shuts light or transmit light when the liquid-crystal shutter 4 is supplied with a voltage, so long as the liquid-crystal shutter 4 performs its light shutting operation when the charging voltage of the power source circuit 9 reaches a predetermined value. As the secondary battery, a nickel-cadmium battery, a nickel-hydrogen battery, a lithium ion battery, or the like, may be used. As the light diffusion plate 3 of the back-light portion, any material may be used so long as it can transmit external light to the solar-cell panel 5. In the case where external light is used for back-light or in the case where it is not necessary to use back-light, the lamps 2 and 2a and the light diffusion plate 3 may be omitted.

As described above, in the liquid-crystal display device having such a structure according to the present invention, a solar-cell panel having an area substantially equal to the area of a liquid-crystal panel can be provided without providing an additional installation space for the solar-cell panel on the installation place of the liquid-crystal panel. Accordingly, there is not only an advantage that the voltage of an auxiliary power source portion can be recovered when a comparatively short time in operation is stopped to thereby prolong the available time for display operation but also an advantage that the liquid-crystal display device can operate if the auxiliary power source portion is charged even when the main battery is exhausted so that it is not necessary to carry an excessive number of spare power sources which are heavy and bulky.

What is claimed is:

1. A liquid-crystal display device comprising:
   a liquid-crystal panel for displaying an image;
   a solar-cell panel disposed behind said liquid-crystal panel;
   a liquid-crystal shutter provided between said liquid-crystal panel and said solar-cell panel for controlling a quantity of light transmitted to said solar-cell panel through said liquid-crystal panel; and
   a power source circuit which is charged by electromotive force generated in said solar-cell panel.

2. The liquid-crystal display device according to claim 1, further comprising a back-light portion provided between said liquid-crystal panel and said liquid-crystal shutter for making said liquid-crystal panel bright to make it easy to see.

3. The liquid-crystal display device according to claim 2, wherein said back-light portion includes a light diffusion plate and a light source provided on a side of the light diffusion plate.

4. The liquid-crystal display device according to claim 1, wherein said solar-cell panel has a light receiving area which is substantially equal to the area of said liquid-crystal panel.

5. The liquid-crystal display device according to claim 1, wherein said liquid-crystal shutter has a shutter portion divided into a plurality of divisional portions so that light is transmitted selectively through any of the divisional portions.

6. The liquid-crystal display device according to claim 1, wherein said liquid-crystal panel has a dot-matrix display system.

7. The liquid-crystal display device according to claim 1, wherein said liquid-crystal shutter operates in a manner so that said liquid-crystal shutter allows light to pass therethrough to said solar-cell panel to make said solar-cell panel charge said power source circuit when no image is displayed on said liquid-crystal panel, while said liquid-crystal shutter shuts off light to said solar-cell panel when an image is displayed on said liquid-crystal panel.

* * * * *